United States Patent [19]

Mongeon et al.

[11] Patent Number: 4,818,855

[45] Date of Patent: Apr. 4, 1989

[54] IDENTIFICATION SYSTEM

[75] Inventors: Ronald W. Mongeon; David P. Sidlauskas, both of San Jose; Theodore D. Geiszler, Los Gatos, all of Calif.

[73] Assignee: Indala Corporation, San Jose, Calif.

[21] Appl. No.: 816,873

[22] Filed: Jan. 7, 1986

Related U.S. Application Data

[63] Continuation-in-part of Ser. No. 690,849, Jan. 11, 1985, abandoned.

[51] Int. Cl.$^4$ ............................................. G06K 7/00
[52] U.S. Cl. ..................................... 235/440; 235/449; 235/451; 235/492; 340/825.72; 340/825.54
[58] Field of Search ............... 235/380, 441, 449, 492, 235/493, 451, 440; 340/825.54, 825.72

[56] References Cited

U.S. PATENT DOCUMENTS

| 3,098,971 | 7/1963 | Richardson . |
| 3,117,277 | 1/1964 | de Magondeaux . |
| 3,270,338 | 8/1966 | Watters . |
| 3,299,424 | 1/1967 | Vinding . |
| 3,377,616 | 4/1968 | Auer, Jr. . |
| 3,487,310 | 12/1969 | Bateman et al. . |
| 3,636,453 | 1/1972 | George . |
| 3,641,433 | 2/1972 | Mifflin et al. . |
| 3,755,803 | 8/1973 | Cole et al. . |
| 3,806,941 | 4/1974 | Cheal . |
| 3,872,435 | 3/1975 | Cestaro . |
| 3,944,928 | 3/1976 | Augenblick et al. . |
| 4,007,355 | 2/1977 | Moreno . |
| 4,019,181 | 4/1977 | Olsson et al. . |
| 4,068,232 | 1/1978 | Meyers et al. . |
| 4,114,151 | 9/1978 | Denne et al. . |
| 4,134,068 | 1/1979 | Richardson . |
| 4,189,712 | 2/1980 | Lemelson . |
| 4,196,347 | 4/1980 | Hadley ................................ 455/603 |
| 4,196,418 | 4/1980 | Kip et al. . |
| 4,215,348 | 7/1980 | Cordaro et al. ........................ 370/97 |
| 4,236,068 | 11/1980 | Walton ................................. 235/380 |
| 4,276,638 | 6/1981 | Andreucci et al. ..................... 370/30 |
| 4,277,837 | 7/1981 | Stuckert ................................ 364/900 |
| 4,302,846 | 11/1981 | Stephen et al. ........................ 455/19 |
| 4,308,530 | 12/1981 | Kip et al. ............................. 340/572 |
| 4,353,064 | 10/1982 | Stamm ............................ 340/825.31 |
| 4,384,288 | 5/1983 | Walton ........................... 340/825.34 |
| 4,388,524 | 6/1983 | Walton ............................... 235/380 |
| 4,580,041 | 4/1986 | Walton ............................... 235/380 |
| 4,605,844 | 8/1986 | Haggan ........................... 235/492 X |
| 4,630,044 | 12/1986 | Polzer ............................ 340/825.54 |
| 4,650,981 | 3/1987 | Foletta ........................... 235/380 X |

Primary Examiner—David L. Trafton
Attorney, Agent, or Firm—Spencer & Frank

[57] ABSTRACT

A remotely powered portable member having circuitry for storing and transmitting coded information. A first coupling device is provided for receiving a signal transmitted via one of a magnetic field and an electric field. A power circuit is connected to the first coupling device for deriving operating power from the received signal for use by the circuitry. A second coupling device is connected to the circuitry for transmitting coded information stored by the circuitry via the other one of the magnetic field and electric field.

24 Claims, 6 Drawing Sheets

IDENTIFICATION SYSTEM

CROSS REFERENCE TO RELATED APPLICATION

This application is a Continuation-In-Part of Copending Patent Application Ser. No. 06/690,849, filed Jan. 11th, 1984 now abandoned.

BACKGROUND OF THE INVENTION

The present invention relates to an identification system composed of a proximity powered and coded portable unit and a corresponding energization and interrogation device which has a fixed installation. The portable unit may be in the form of a tag or card, and for convenience is referred to herein as a tag. However, the portable unit may also be incorporated in a badge, watch, ring or other article.

The present invention thus relates to a system wherein a fixed installation sends out energy to activate a responsive device which would ordinarily be carried by personnel and the device so energized would send out a coded signal to be picked up by a receiver which in turn would activate some system which, for example, functions to provide access to a controlled area, to keep track of the person, or to perform siimilar purposes.

In known systems of the above type power is provided by means of magnetic coupling, and the coded information is returned via the same path. Typical methods of encoding which have been proposed include switching of the Q of the coded tag receiver loop, by switching its frequency, introducing harmonics of the basic frequency, and other similar coding methods. These methods have proved difficult in practice because of the direct or harmonic relationship between the very large powering signal and the much weaker information signal.

SUMMARY OF THE INVENTION

It is an object of the present invention to overcome the limitations of the prior art identification systems by transmitting the coded information from the tag in a mode that is completely different from that which is used to transmit power to the tag. In accordance with a preferred embodiment of the present invention, power is transmitted to the tag via magnetic field coupling, while the coded information is transmitted back to the fixed receiver via electric field coupling. The provision of different coupling modes for the signal transmitting power and for the return coded signal has the advantage of being more practical in application with reduced cost and increased reliability relative to the known systems of this type.

In accordance with a preferred embodiment of the invention, further isolation between the transmitted and received signal is provided by operating the fixed receiver and the tag transmitter at a subharmonic of the frequency used to transmit the power.

Various additional features and advantages of the invention will be brought out in the balance of the application.

DESCRIPTION OF THE PREFERRED EMBODIMENTS

Figure 1:
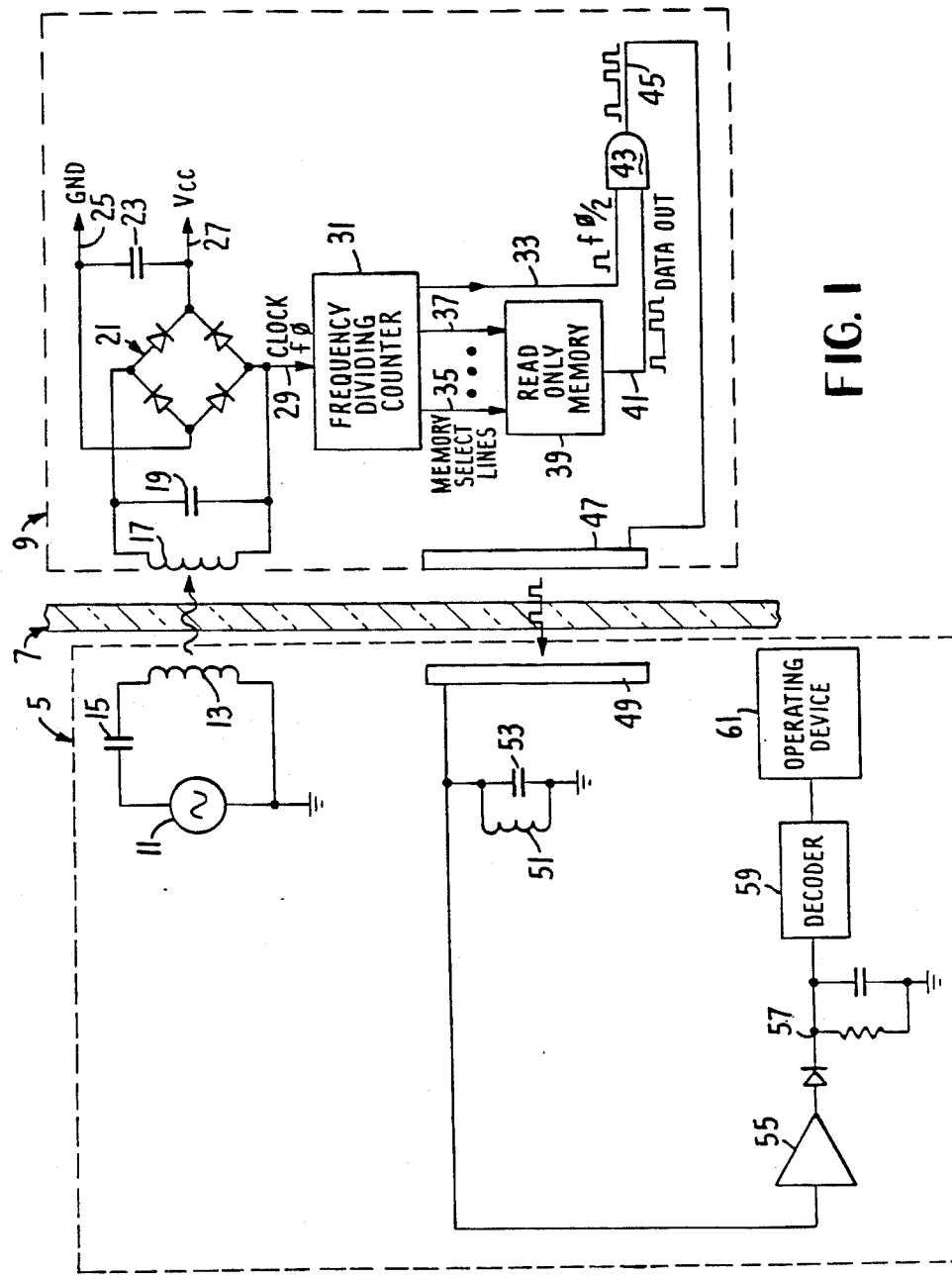
FIG. 1 is a block circuit diagram of an identification system according to one embodiment of the invention, it being understood that those portions of the drawing on the left are part of a fixed installation, while those on the right are on a portable unit, such as a card or a tag, carried by a person.

Referring now to the drawings, a system embodying the present invention is shown in FIG. 1. In this figure, a fixed installation, generaly designated 5, is mounted on a convenient wall or window 7. The balance of the material shown in the drawing, which is generally designated 9, is contained on a card or tag and carried by personnel.

The power supply consists of an oscillator 11 which puts out power at a convenient frequency such as 400 KHz. This is connected to a coil antenna 13 tuned to the resonant frequency by means of capacitor 15. Coil 13 emits a strong magnetic field and, as later explained in detail, is preferably provided with a Faraday shield to avoid capacative or electrostatic coupling to the tag receiver.

The tag 9 includes a coil 17 and a capacitor 19 which form a tuned LC circuit resonant with coil 13 to provide a power supply as well as a clock signal of frequency fO for the tag circuits. A full wave rectifier 21 and filter capacitor 23, connected across coil 17 and capacitor 19, provide power for the coded transmitter circuits of the tag through lines 25 and 27, the connections of which are not shown for simplicity. The clock signal is taken through a line 29 to a frequency dividing counter 31 to produce an R.F. signal of frequency f0/2 on line 33 and address signals on a plurality of memory select lines, only two of which have been shown at 35 and 37 for activating a programmable read only memory 39 which provides a plurality of coded pulses through line 41. Lines 33 and 41 go to an AND gate 43 which produces output pulses on a line 45 which are fed to an electrostatic antenna 47. The coded pulses on line 41 are at a much lower rate than the signal of frequency f0/2 on line 33. The effect of AND gate 43 is to square wave modulate the signal on line 33 with the coded pulse train on line 41, producing a square wave modulated signal on line 45.

The pulses from the electrostatic antenna 47 are picked up at the fixed installation by a metal plate receiving antenna 49, tuned by a coil 51 and a capacitor 53, passed through an amplifier 55, and are detected by an RC amplitude detector and filter 57 and passed to a decoder 59 for validation in a manner well known in the art. Assuming that the right signal has been given, an operating device 61 is then triggered. Operating device 61 might take many forms, such as a security device for admitting one to a secure area, or a device for recording the location of the person carrying the badge and the like.

Figure 2:
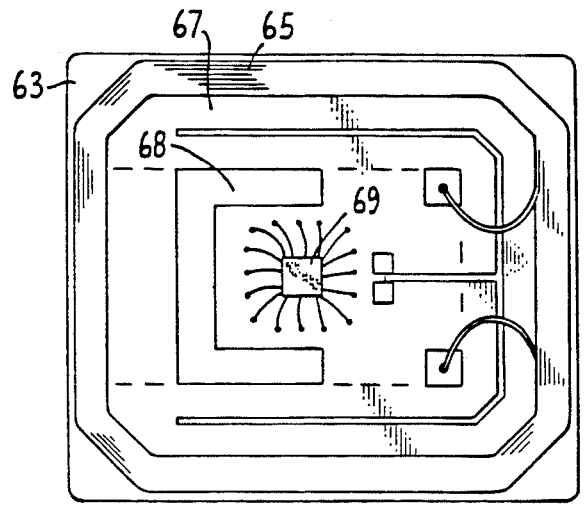
FIG. 2 is an enlarged plan view of a tag carried by a user of the system.

FIG. 2 shows a typical tag 62 which might be employed. Tag 62 includes a backing member 63 which supports a flattened coil of wire 65, which corresponds with coil 17 in FIG. 1 and a flat electrostatic antenna 67, which corresponds with antenna 47 in FIG. 1. Tag 62 further includes a programmable read only memory (PROM) 68 which can be programmed by making or breaking electrical connections. Other than the two antennas and the PROM, the other circuitry shown within the dotted line designated by the reference numeral 9 in FIG. 1 is embodied in a chip 69. The whole tag 62 is roughly 1"×1.4" or smaller in size. It will be noted that the antennas 65 and 67 in FIG. 2 are coplanar and concentric.

Figure 3:
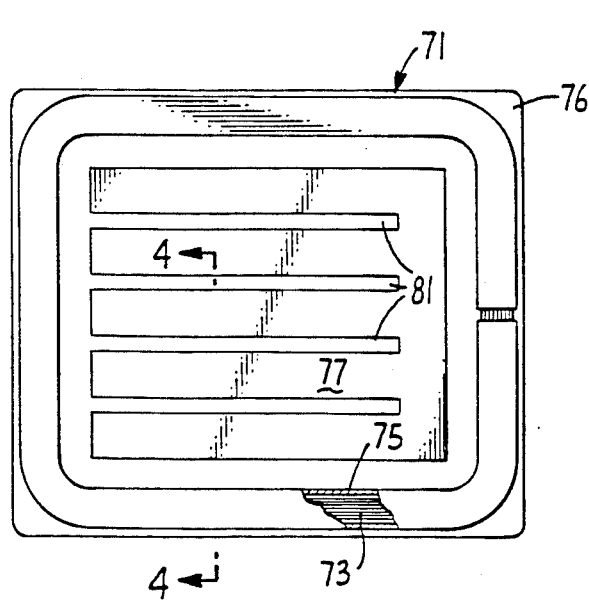
FIG. 3 is a plan view of a dual antenna for a fixed installation including a power transmitting antenna enclosed within a foil Faraday shield, together with a concentric electrostatic receiving antenna.
Figure 4:
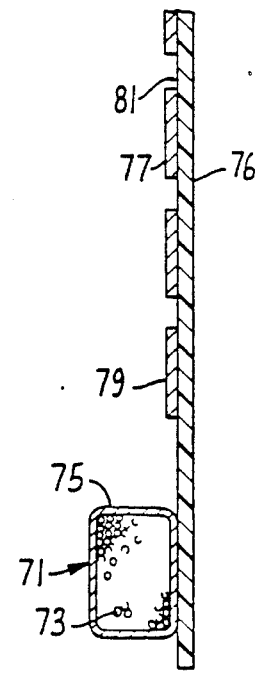
FIG. 4 is an enlarged section on the line 4—4 of FIG. 3.

In FIG. 3 the two antennas 13 and 49 which form part of the fixed equipment designated 5 in FIG. 1 are shown. Here, the transmitting antenna 71, which corresponds with coil 13 in FIG. 1, consists of many turns of wire 73 enclosed within a Faraday shield 75 mounted on a base 76. Faraday shield 75 is merely aluminum foil or other non-magnetic metal wrapped around the coil with a transverse gap. This of course allows the magnetic flux to escape, but prevents electrostatic coupling. The electostatic antenna 77 consists of a plate of metal 79 (see FIG. 4) with slots 81 which prevent the plate from becoming a shorted turn. Here again it will be seen that the transmitting and receiving antennas are coplanar and coaxial.

It will be noted that in FIG. 1, the antenna pairs 13, 49 and 17, 47 are coplanar but are in side-by-side configuration. It is important that the two antennas of each pair be roughly coplanar. It is not necessary that the two antennas be coaxial or that they be precisely on the same plane.

Figure 5:
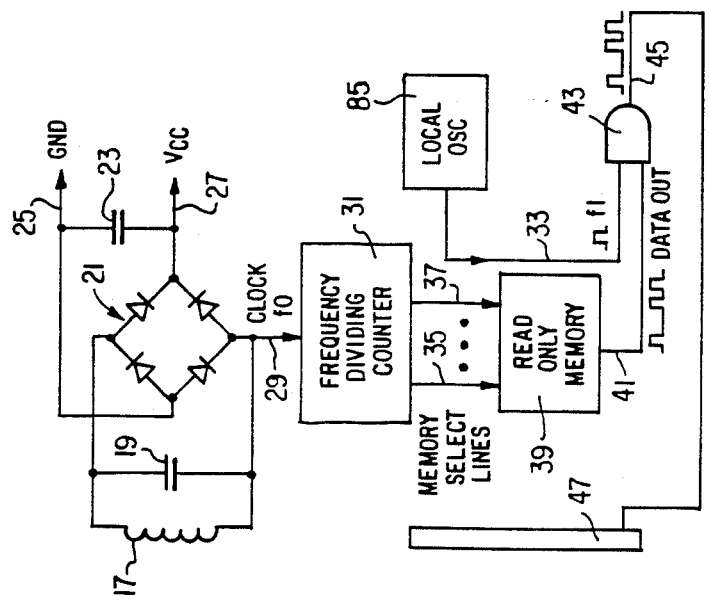
FIG. 5 is a block circuit diagram illustrating a modification of the tag shown in FIG. 1.

FIG. 5 shows a modification of the circuitry contained on the tag (designated 9 in FIG. 1) wherein, instead of employing the RF signal from line 33, a separate local, free-running oscillator 85 is employed to provide a carrier signal of frequency f1 which is modulated by the data on line 41 from read only memory 39. Preferably the frequency f1 is higher than the frequency f0 by at least an order of magnitude. By increasing the frequency of the modulated carrier signal fed to electrostatic antenna 47, the signal transmitted via the electric field will have increased power and will be effective over a greater distance. This is particularly useful in applications where the tag is spaced apart from the fixed installation by such a distance that the signal transmitted via the magnetic field reaches the tag with reduced power and generates an operating voltage VCC of insufficient magnitude for purposes of transmitting the coded information. As the distance between the tag and the fixed installation increases and the operating voltage VCC thus decreases, the voltage magnitude of the modulated carrier reaching electrostatic antenna 47 will be reduced to such a level that the power contained in the transmitted signal will be insufficient to provide a useful signal at the receiver end of the fixed installation. The reduction in voltage level of the carrier signal can be overcome in part by increasing the frequency of the carrier with the use of the local oscillator as shown in FIG. 5.

Figure 6A:
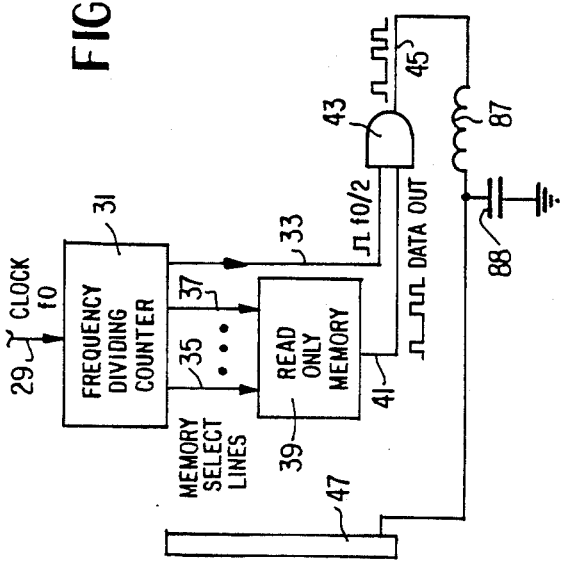
FIGS. 6a and 6b are block circuit diagrams illustrating further modifications of the tag shown in FIG. 1.

FIG. 6a shows another modification of the circuitry on the tag of FIG. 1 which provides an alternative resolution to the problem of reduced operating voltage VCC. In FIG. 6a, a coil 87 and a capacitor 88 are connected in series between the AND gate 43 and ground, with the junction between these two components being connected to the electrostatic antenna 47. The inductance and capacitance of the coil 87 and capacitor 88, respectively, are chosen to produce an LC circuit tuned to the frequency f0/2 and to have a Q which in essence constitutes a voltage multiplier for increasing the magnitude of the voltage pulses on line 45. By increasing the voltage of the pulses reaching electrostatic antenna 47, the power of the signal transmitted via the electric field will be increased and will offset the reduction in the operating voltage VCC caused by an increase in the distance between the tag and the fixed installation.

Figure 6B:
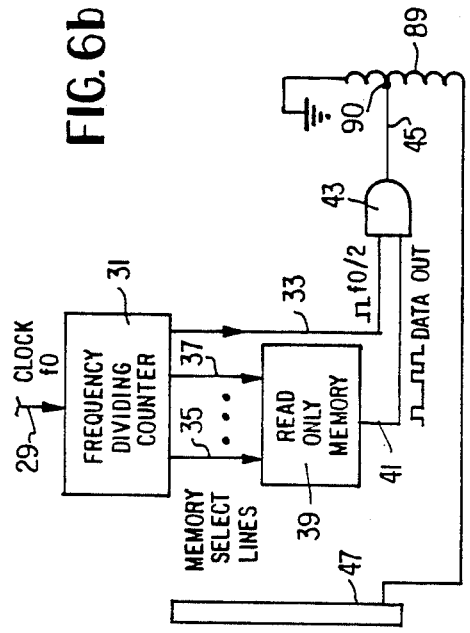

As an alternative to the tuned LC circuit composed of coil 87 and capacitor 88, an autotransformer comprised of a coil 89 having a tap 90 may be employed as shown in FIG. 6b to produce a similar increase in voltage of the modulated carrier on line 45. The modulated carrier on line 45 is fed to tap 90. One end of coil 89 is tied to ground and the other end is connected to the electrostatic antenna 47. As the signal is driven through tap 90 to ground, transformer action induces voltage in the remaining portion of coil 89. This voltage adds to the applied voltage, resulting in a higher voltage signal being applied to antenna 47.

Figure 7:
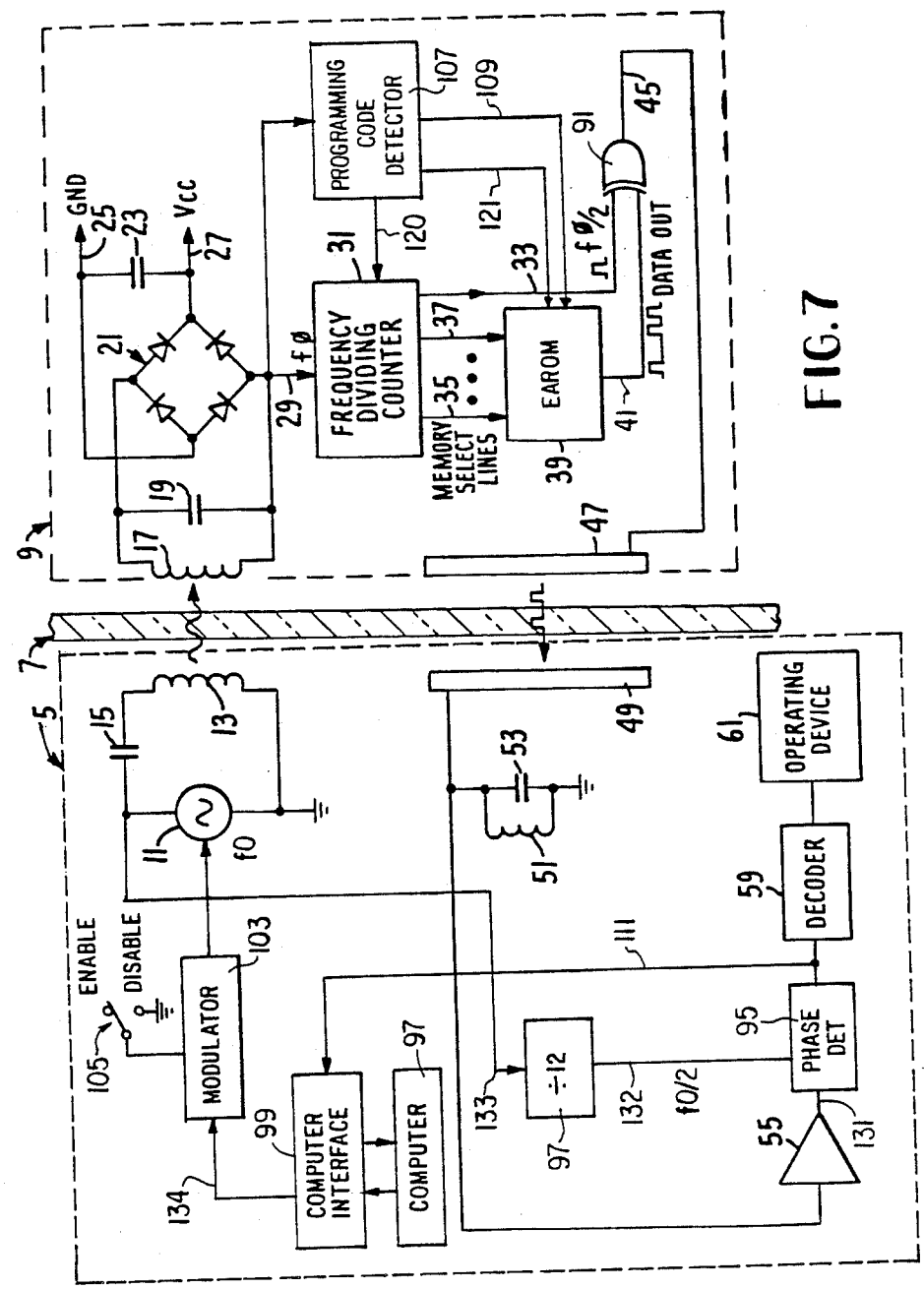
FIG. 7 is a block circuit diagram of another embodiment of an identification system according to the invention.

FIG. 7 illustrates another embodiment of the invention wherein the read only memory is electrically alterable, and the data contained in the read only memory is programmed by a signal transmitted via the magnetic field coupling between the fixed installation and the tag. Additionally, according to the embodiment of FIG. 7 the signal transmitted by the tag via the electric field incurs phase modulation (PM) as opposed to the amplitude modulation (AM) as in the case of the circuit of FIG. 1. The components in FIG. 7 which correspond to those in FIG. 1 are designated by the same reference numerals used in FIG. 1.

Shown in FIG. 7 is the excitation oscillator 11 connected to a series resonant circuit consisting of inductor 13 and capacitor 15. Inductor 13 is wound in the form of a loop of such size to produce a significant magnetic field within the desirable tag operating distance. Capacitor 15 is chosen so that the circuit is resonant at the frequency f0 of oscillator 11.

At the tag 9, inductor 17 is connected in parallel with the capacitor 19. The capacitor 17 is chosen to produce a resonant circuit at the frequency f0 of the oscillator 11. Inductor 17 is also connected to the bridge rectifier 21. The output of the bridge rectifier is connected to filter capacitor 23, one side of which is connected to tag circuit ground 25, and the other side of which connects to the tag circuit Vcc power 27.

The voltage signal from the tuned LC circuit composed of capacitor 19 and inductor 17, is also connected to the input 29 of the frequency dividing counter 31. The output of the first divide by two stage of this counter 31 is connected to an input of an exclusive OR gate 91 so that exclusive OR gate 91 receives a signal of frequency f0/2 at this input. The outputs 35 through 37 of subsequent stages of the counter 31 ar connected to the address select lines of an electrically alterable read only memory (EAROM) 93. The divider ratios of the frequency dividing counter 31 are such that the outputs 35 through 37 change state relatively slowly with respect to the clock signal on the input line 29, a typical value being one state change for every 10 clock cycles. The data output signal on line 41 from the EAROM 93 is connected to a second input of the exclusive OR gate 91. The output on line 45 of the exclusive OR gate 91 is connected to the electrostatic antenna 47.

The signal from the tuned LC circuit composed of capacitor 19 and inductor 17, also connects to the input 107 of the programming code detector 107. The data output line 109 of the programming code detector 107 connects to the programming data input of the EAROM 93. A second output 121 of the programming code detector 107 is connected to the program enable input of the EAROM 93. A third output 120 of the programming code detector 107 is connected to the count reset input of the frequency dividing counter 31.

As in the circuit of FIG. 1, at the fixed installation the receiving antenna 49 is connected to a parallel resonant tuning and filter circuit consisting of capacitor 53 and inductor 51. The value of these two components is chosen to produce a resonant circuit at the frequency of the signal expected from the electrostatic antenna 47. The signal from antenna 49 is also applied to the input of amplifier 55. The output of amplifier 55 is connected to a signal line 131 to one input of a phase detector 95. A reference signal of frequency f0 is obtained from the oscillator 11 and is fed to a divide by two frequency divider 97 via a line 133. The output of the frequency divider 97 is connected via signal line 132 to a reference input of the phase detector 95. The output of the phase detector 95 is connected to the input of decoder 59 whose output is in turn connected to the operating device 61.

The output of the phase detector 95 is also connected via a line 111 to a computer interface 99. The computer interface 99 is in turn connected to a controlling computer 97. An output of the computer interface 99 is connected via line 134 to the modulation control input of a modulator 103. A switch 105 is connected to an enable input of the modulator 103. The output of the modulator 103 is in turn connected to a control input of the oscillator 11. The modulator 103 may be of an amplitude, phase or frequency type, remaining within the spirit of this invention.

In operation, the system of FIG. 7 may function in two different modes, a normal operating mode and a programming mode. In the normal operating mode the switch 105 is set to the disable position, disabling the modulator 103. This inhibits the output of modulator 103 causing the oscillator 11 to operate in a steady mode, with no modulation of its signal. In this mode, the computer 97 and computer interface 99 are not utilized.

As in the circuit of FIG. 1, oscillator 11 excites the resonant circuit of capacitor 15 and inductor 13, creating a large resonant current in inductor 13 and consequently a strong magnetic field in the region of this inductor. When the inductor 17 of the tag 9 is brought into this field, energy is transferred via the inductive coupling between inductors 13 and 17 creating a large oscillating voltage across the parallel resonant circuit of inductor 17 and capacitor 19. This voltage is converted to a direct voltage by rectifier 21 and filtered by capacitor 23. The resulting filtered voltage appearing at line 27 is used to power the remaining elements of the circuit of the tag 9.

The oscillating voltage induced in inductor 17 functions as the clocking signal for the frequency dividing counter 31. The memory select output lines 35 through 37 of frequency divider 31 change state in binary progression in step with the clock input signal on line 29 such that successive memory cells of the EAROM 93 are selected. As each cell is selected, a signal representing the data contents of the selected cell appears at the EAROM data output on line 41 and at one input of the exclusive OR gate 91. The second input of the exclusive OR gate receives a signal at a frequency of f0/2. As described above, the frequency dividing counter 31 is designed such that the frequency of change of state of the memory access lines, and consequently of the memory data output line 41, is much less than f0/2, typically f0/10 or less.

When the output data line 41 of the EAROM 93 is at a low voltage state, corresponding to a logical 0 value of the selected EAROM data cell, the exclusive OR gate 91 passes the f0/2 signal to its output with virtually no change. When the output line 41 of the EAROM is at a high voltage state, corresponding to a logical 1 value of the selected EAROM data cell, the exclusive OR gate 91 inverts the amplitude of the f0/2 input signal. That is, when the f0/2 input signal on line 33 is at a high voltage, the output signal on line 45 is at a low voltage and vice versa. This corresponds to a phase shift of 180 degrees in the f0/2 signal. Thus, it is seen that the output of exclusive OR gate 91 is the signal of frequency f0/2 shifted in phase by either 0 degrees or 180 degrees, depending upon the state of the EAROM output signal on line 41.

The output of the exclusive OR gate 91 excites the electrostatic antennas 47 and 49 in the same manner as described for the circuit of FIG. 1. The voltage induced in antenna 49 is amplified by amplifier 55 and detected by phase detector 95. Since the reference signal on line 132 to phase detector 95 is f0/2, the output of the phase detector 95 will be in one state (say low) when the signal on line 131 is in phase with the reference signal on line 132, and in another state (say high) when the reference signal on line 132 and the input signal on line 131 are out of phase. Consequently, the output signal of the phase detector 95 tracks, and is in logical correspondence, to the output signal on line 41 of the EAROM 93. The output signal of the phase detector 95 is then processed by the decoder 59 and the operating device 61 in the same manner as described for the circuit of FIG. 1.

The use of phase rather than amplitude modulation is of advantage in overcoming signals of external interference which can produce a large effect on the amplitude of the received signal, but only a minor effect on its phase.

The second operating mode of the circuit of FIG. 7 is the programming mode which is used to set or alter the state of the EAROM 93. In the operation of this mode, the switch 105 is set to its enable position, allowing the modulator 103 to function in response to signals from the computer 97 sent via the computer interface 99 to the modulator 103. The signal from the computer 97 would typically be a serial stream of digital data made up of an appropriate sequence of start, data and error checking bits. This signal directs the modulator 103 to modulate the output of the oscillator 11. This modulate signal is coupled into the inductive circuit 17 of the tag 9 in the same manner as before. However, in this case, the clocking signal 29 is also modulated with the data stream generated by the computer 97.

The modulated clocking signal appears at the input of the programming code detector 107. In response to the receipt of the synchronization portion of the modulating signal, the programming code detector 107 asserts its counter reset output 120, causing the address select lines of the frequency dividing counter 31 to reset to a known starting address.

In response to the data portion of the modulating signal, the programming code detector 107 sets its data output line 109 to the state directed by the data portion of the modulating signal, and also asserts the EAROM programming control signal on line 121. This causes the state of the data output line 109 to be written into the selected memory cell of the EAROM. This process of receiving a data bit from the modulated signal and writing it to the EAROM is repeated for all cells of the EAROM to be programmed.

Once a programming cycle has been completed as described above, the modulating signal from the computer 97 is turned off, and the circuit of FIG. 7 functions as described for the normal operating mode. As a consequence of this operation, a signal corresponding to the programming of the EAROM 93 of the tag 9 is produced at the output of the phase detector 95 and transmitted to the computer interface via line 111. The computer 97 determines whether this signal is in conformance with the desired program for the EAROM 93. If it is, the programming function is complete. If it is not, the programming function is repeated.

Figure 8:
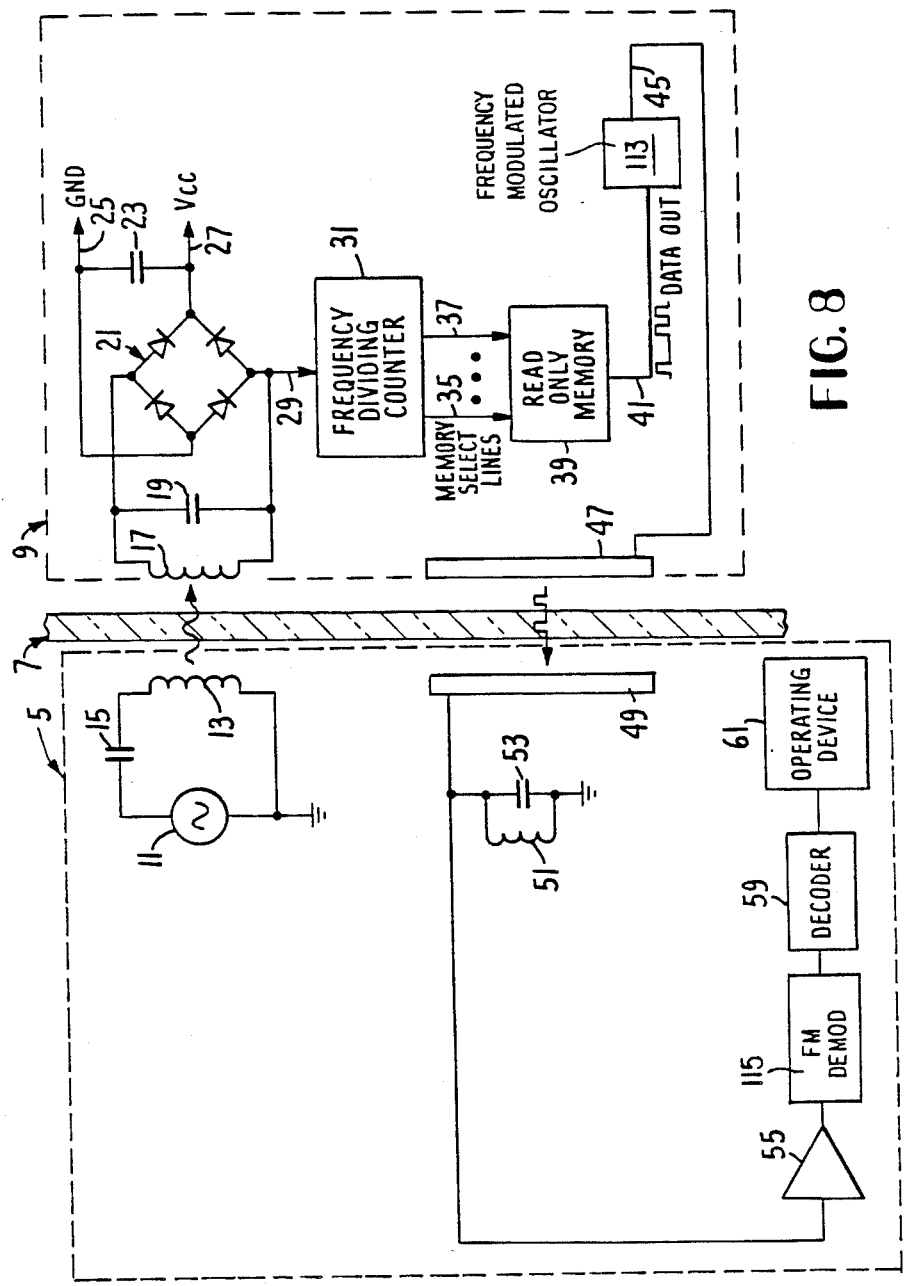
FIG. 8 is a block circuit diagram of a further embodiment of an identification system according to the invention.

FIG. 8 illustrates an embodiment of the invention similar to FIG. 1 except that a frequency modulated oscillator 113 is substituted for the AND gate 43 which produces AM modulation in the embodiment of FIG. 1. The frequency modulated oscillator 113 thus produces a signal on line 45 which has its frequency modulated in accordance with the data on line 41 read out of EAROM 93. The frequency modulated signal is then transmitted via the electric field. At the fixed installation an FM demodulator 115, replacing the AM detector 57 in FIG. 1, demodulates the frequency modulated signal which is otherwise received and utilized in the same manner as described in connection with FIG. 1.

Figure 9:
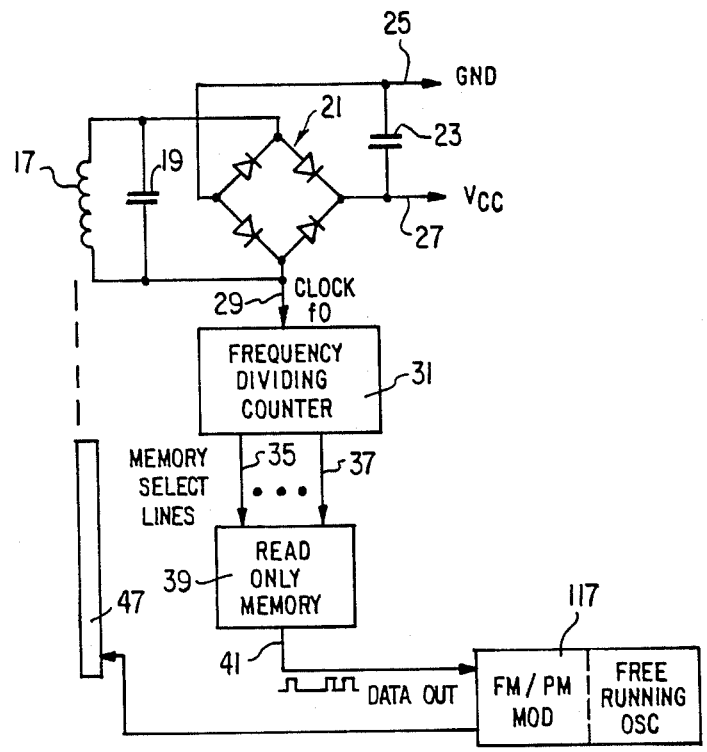
FIG. 9 is a block circuit diagram of yet another embodiment of an identification system according to the invention.

FIG. 9 illustrates the use of a free running oscillator on the tag for locally providing the carrier signal in the cases of phase modulation and frequency modulation. Such a free running oscillator has the same purpose as the local oscillator 85 in FIG. 5, i.e. to increase the range between the tag and the fixed installation at which the fixed installation can still detect the modulated signal transmitted from the tag via the electric field coupling. In FIG. 9, for simplicity, the FM and PM modulators are alternatively shown in schematic form within the same box 117 as the free running oscillator. For FM operation, the data on line 41 is used to change the oscillator frequency between a frequency f1 and a frequency f2, f1 being transmitted when a "1" data bit is present on line 41 and f2 being transmitted when a "0" data bit is present on line 41. In the case of FM operation, the modulator may be part of the oscillator circuit.

For phase modulation, the data on line 41 is used to phase modulate the local oscillator frequency via an exclusive OR gate as described in connection with FIG. 7 to provide a phase modulated signal which has a first phase when a "1" data bit is on line 41 and a second phase when a "0" data bit is on line 41.

The FM and PM receivers at the fixed installation have the appropriate frequency or phase detectors as described in connection with FIGS. 7 and 8 to extract the data from the carriers. Once detected, the data is processed in the same way as described in connection with the AM modulation scheme of FIG. 1.

It will be understood by those skilled in the art that many variations can be made to the embodiments disclosed herein without departing from the spirit of the invention. For example, it is possible to switch the functions of the magnetic and electrostatic field couplings whereby the power is transmitted from the fixed installation to the tag via an electric field and the data word is transmitted from the tag to the fixed installation by a magnetic field. Additionally, it is possible to transmit the power signal via one of the couplings, for example the magnetic field coupling, and to transmit the reprogramming signal for the EAROM in FIG. 7 via the other (capacitive) coupling. In such event, the detector within the programming code detector 107 in FIG. 7 would be connected to the electrostatic antenna 47 and suitably configured for demodulating the reprogramming signal received by such antenna.

In some instances, it may be desirable to employ a battery powered local oscillator on the tag either as a back-up to the passive power circuit on the tag or in lieu thereof.

Those skilled in the art will appreciate that the above description of the present invention is susceptible to various other modifications, changes and adaptations, and the same are intended to be comprehended within the meaning and range of equivalents of the appended claims.

What is claimed is:

1. In a remotely powered portable member having circuitry for storing and transmitting coded information, the improvement comprising:
   first coupling means for receiving a signal of a predetermined frequency transmitted via one of a magnetic field and an electric field;
   power means connected to said first coupling means for deriving operating power from the received signal for use by said circuitry;
   circuit means connecting said circuitry to said first coupling means, for utilizing said predetermined frequency as a clock signal for timing of said circuitry; and
   second coupling means connected to said circuitry for transmitting coded information stored by said circuitry via the other one of the magnetic field and the electric field.

2. A portable member as defined in claim 1, wherein said first coupling means is a magnetic field coupling means for receiving a signal via a magnetic field and said second coupling means is an electrostatic coupling means for transmitting coded information via an electric field.

3. A portable member as defined in claim 1, wherein said circuitry includes a programmable read only memory for storing coded information.

4. A portable member as defined in claim 3, wherein: said programmable read only memory is an electrically alterable read only memory; said signal of a predetermined frequency is a modulated carrier signal; and said circuitry further includes programming means, connected to said first coupling means, for detecting a modulated carrier signal which contains programming information, said programming means being connected to said electrically alterable read only memory for programming said electrically alterable read only memory in accordance with said programming information.

5. A portable member as defined in claim 4, wherein said first coupling means is a magnetic field coupling means for receiving a signal via a magnetic field and said second coupling means is an electrostatic coupling means for transmitting coded information via an electric field.

6. A portable member as defined in claim 1, wherein said circuitry includes frequency dividing means connected to said first coupling means for deriving a carrier signal having a frequency which is sub-multiple of the predetermined frequency and modulating means having an output connected to said second coupling means, one input coupled to the carrier signal and another input coupled for receiving the coded information for modulating the carrier signal with the coded information.

7. A portable member as defined in claim 1, wherein said circuitry includes a local oscillator for producing a carrier signal which has a frequency generated independently of the predetermined frequency, and modulating means having an output connected to said second coupling means, one input coupled to the carrier signal and another input coupled for receiving the coded information for modulating the carrier signal with the coded information.

8. A portable member as defined in claim 7, wherein said local oscillator produces a carrier signal having a frequency substantially higher than the predetermined frequency.

9. A portable member as defined in claim 1, wherein said circuitry includes: carrier signal means for producing a carrier signal; modulating means having an input connected to said carrier signal means, another input coupled for receiving the coded information and an output, said modulating means modulating the carrier signal with the coded information to produce a modulated carrier signal at said output; and voltage multiplier means connected between said modulating means and said second coupling means for increasing the voltage magnitude of the modulated carrier signal.

10. A portable member as defined in claim 9, wherein said voltage multiplier means is passive.

11. A portable member as defined in claim 10, wherein said voltage multiplier means includes a series connected inductor and capacitor having a common connection point which is connected to said second coupling means 12. A portable member as defined in claim 10, wherein said voltage multiplier means includes an autotransformer.

13. A portable member as defined in claim 1, wherein said circuitry includes carrier signal means for producing a carrier signal; modulating means having an input connected to said carrier signal means, another input coupled for receiving the coded information, and an output connected to said second coupling means, said modulating means modulating the carrier signal to produce a modulated carrier signal at said output.

14. A portable member as defined in claim 13, wherein said modulating means comprises an amplitiude modulator.

15. A portable member as defined in claim 13, wherein said modulating means comprises a phase modulator.

16. A portable member as defined in claim 13, wherein said modulating means comprises a frequency modulator.

17. A portable member as defined in claim 2, wherein said first coupling means comprises a coil and said second coupling means comprises an electrostatic antenna and said coil and said antenna are mounted to be substantially coplanar with one another.

18. A portable member as defined in claim 17, wherein said coil and said antenna are coaxially positioned relative to one another.

19. A portable member as defined in claim 1, wherein said member is in the form of a tag, card, badge, ring, watch, or other similar type of portable article.

20. A remotely powered portable member having circuitry for storing and transmitting coded information comprising:
  a read-only memory for storing coded information
  first coupling means for receiving a signal of a predetermined frequency transmitted via a magnetic field;
  power means connected to said first coupling means for deriving power from the received signal for use by the circuitry in said portable member;
  circuit means, connected to said first coupling means and responsive to said predetermined frequency of a received signal, for reading said coded information from said read only memory;
  means for generating a carrier signal;
  modulating means for modulating said carrier signal with the read coded information from said memory;
  and second coupling means connected to the output of said modulating means for transmitting the modulated carrier signal via an electric field.

21. A portable member as defined in claim 20, wherein said means for generating a carrier signal generates a carrier signal whose frequency is a sub-multiple of said predetermined frequency.

22. A portable member as defined in claim 21, wherein said means for reading said memory and said means for generating a carrier signal are both realized by a frequency divider having a plurality of outputs connected to address lines of said memory and a further output connected to said means for modulating.

23. A portable device as defined in claim 22, wherein said means for modulating comprises a phase modulator.

24. A portable device as defined in claim 23, wherein said phase modulator comprises an exclusive OR-gate.

* * * * *